United States Patent
Kwon et al.

(10) Patent No.: US 7,554,386 B2
(45) Date of Patent: Jun. 30, 2009

(54) HIGH VOLTAGE GENERATION CIRCUIT AND METHOD FOR REDUCING PEAK CURRENT AND POWER NOISE FOR A SEMICONDUCTOR MEMORY DEVICE

(75) Inventors: Oh Suk Kwon, Yongin-si (KR); Ki Hwan Choi, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 3 days.

(21) Appl. No.: 11/962,436

(22) Filed: Dec. 21, 2007

(65) Prior Publication Data

US 2008/0191785 A1    Aug. 14, 2008

(30) Foreign Application Priority Data

Feb. 12, 2007   (KR) .................. 10-2007-0014467

(51) Int. Cl.
  *G05F 1/10* (2006.01)
  *G05F 3/02* (2006.01)
(52) U.S. Cl. .................. 327/536; 327/535; 363/59; 363/60
(58) Field of Classification Search .......... 327/535, 327/536; 363/59, 60
  See application file for complete search history.

(56) References Cited

U.S. PATENT DOCUMENTS

| | | | |
|---|---|---|---|
| 5,781,473 A | 7/1998 | Javanifard et al. | |
| 6,002,599 A * | 12/1999 | Chow | 363/59 |
| 6,927,620 B2 * | 8/2005 | Senda | 327/536 |
| 7,030,683 B2 * | 4/2006 | Pan et al. | 327/536 |
| 7,427,889 B2 * | 9/2008 | Lin et al. | 327/536 |
| 7,439,794 B2 * | 10/2008 | Takeyama et al. | 327/536 |
| 7,446,596 B1 * | 11/2008 | Fort et al. | 327/536 |
| 2004/0150463 A1 * | 8/2004 | Senda | 327/534 |
| 2008/0042728 A1 * | 2/2008 | Kwean | 327/536 |
| 2008/0080287 A1 * | 4/2008 | Kang | 365/226 |

FOREIGN PATENT DOCUMENTS

| | | |
|---|---|---|
| JP | 2000331489 | 11/2000 |
| JP | 2001176279 | 6/2001 |
| JP | 2004005773 | 1/2004 |
| KR | 1020060104893 A | 10/2006 |

* cited by examiner

*Primary Examiner*—Kenneth B Wells
*Assistant Examiner*—Adam D Houston
(74) *Attorney, Agent, or Firm*—Volentine & Whitt, PLLC

(57) ABSTRACT

A high voltage generation circuit for use with a semiconductor memory device includes a plurality of high voltage generation units and a control circuit. The high voltage generation units generate high voltages having different voltage levels in response to corresponding clock signals. The control circuit generates clock signals, which do not toggle simultaneously, based on the voltage levels of the high voltages.

8 Claims, 7 Drawing Sheets

HIGH VOLTAGE GENERATION CIRCUIT AND METHOD FOR REDUCING PEAK CURRENT AND POWER NOISE FOR A SEMICONDUCTOR MEMORY DEVICE

CROSS-REFERENCE TO RELATED APPLICATION

This U.S. non-provisional application claims priority under 35 U.S.C. § 119 of Korean Patent Application No. 10-2007-0014467 filed on Feb. 12, 2007 the entire contents of which are hereby incorporated by reference.

BACKGROUND OF THE INVENTION

1. Field of the Invention

Embodiments of the invention relate to a high voltage generation circuit for a semiconductor memory device. More particularly, embodiments of the invention relate to a high voltage generation circuit and method for reducing a peak value of consumption current and power noise.

2. Description of the Related Art

Semiconductor memory devices such as NAND flash memories, NOR flash memories, and electrically erasable programmable read-only memories (EEPROM) use a voltage higher than a normal power supply voltage to program or erase memory cells. For example, a flash memory device needs voltages having different voltage levels when performing program, erase, and read operations of memory cells. Thus, a voltage generation circuit is required to generate a plurality of high voltages having different voltage levels to accommodate these various operations.

FIG. 1 is a block diagram of a conventional high voltage generation circuit 100 having a plurality of high voltage generation units 110 and 120. These voltage units 110 and 120 generate high voltages VPP1 and VPP2, respectively, having different voltage levels. Voltage generation unit 110 includes regulator 112, clock generator 114 and pump 116. Similarly, voltage generation unit 120 includes regulator 122, clock generator 124, and pump 126. Regulators 112 and 122 generate enable signals EN_CLK1 or EN_CLK2 based on the voltage level of VPP1 or VPP2. Each of the regulators 112 and 122 generate the clock signal CLK1 or CLK2, respectively, in response to the corresponding enable signals EN_CLK1 or EN_CLK2. Clock signals CLK1 and CLK2 may have the same phase. Pumps 116 and 126 receive clock signals CLK1 and CLK2 and output high voltages VPP1 and VPP2 corresponding to the respective clock signals CLK1 and CLK2. As illustrated in FIG. 2, when the clock signals CLK1 and CLK2 have the same phase, the pumps 116 and 126 simultaneously start a pumping operation for generating high voltages VPP1 and VPP2. When pumps 116 and 126 simultaneously output high voltages VPP1 and VPP2, a peak value of consumption current and power noise in the high voltage generation circuit 100 increases. Moreover, when clock signals CLK1 and CLK2 have the same phase, pumps 116 and 126 perform the pumping operation at the same time. This causes the peak value of the consumption current and the power noise to further increase. Accordingly, in order to generate a stable high voltage in high voltage generation circuit 100, reduction of the peak value of the consumption current and power noise is desired.

SUMMARY OF THE INVENTION

Exemplary embodiments of the present invention are directed to a high voltage generation circuit and method for reducing a peak value of consumption current and power noise by controlling a toggling period or a phase of clock signals for generating a plurality of high voltages for a semiconductor memory device. In an exemplary embodiment, the high voltage generation circuit includes a plurality of high voltage generation units configured to respectively generate high voltage signals having different voltage levels in response to first clock signals The high voltage generation units are configured to generate second clock signals based on the voltage levels of the high voltage signals, respectively. A control circuit is used to receive the second clock signals and to generate the first clock signals. The first clock signals do not toggle simultaneously based on the second clock signals.

DESCRIPTION OF EMBODIMENTS

Figure 1:
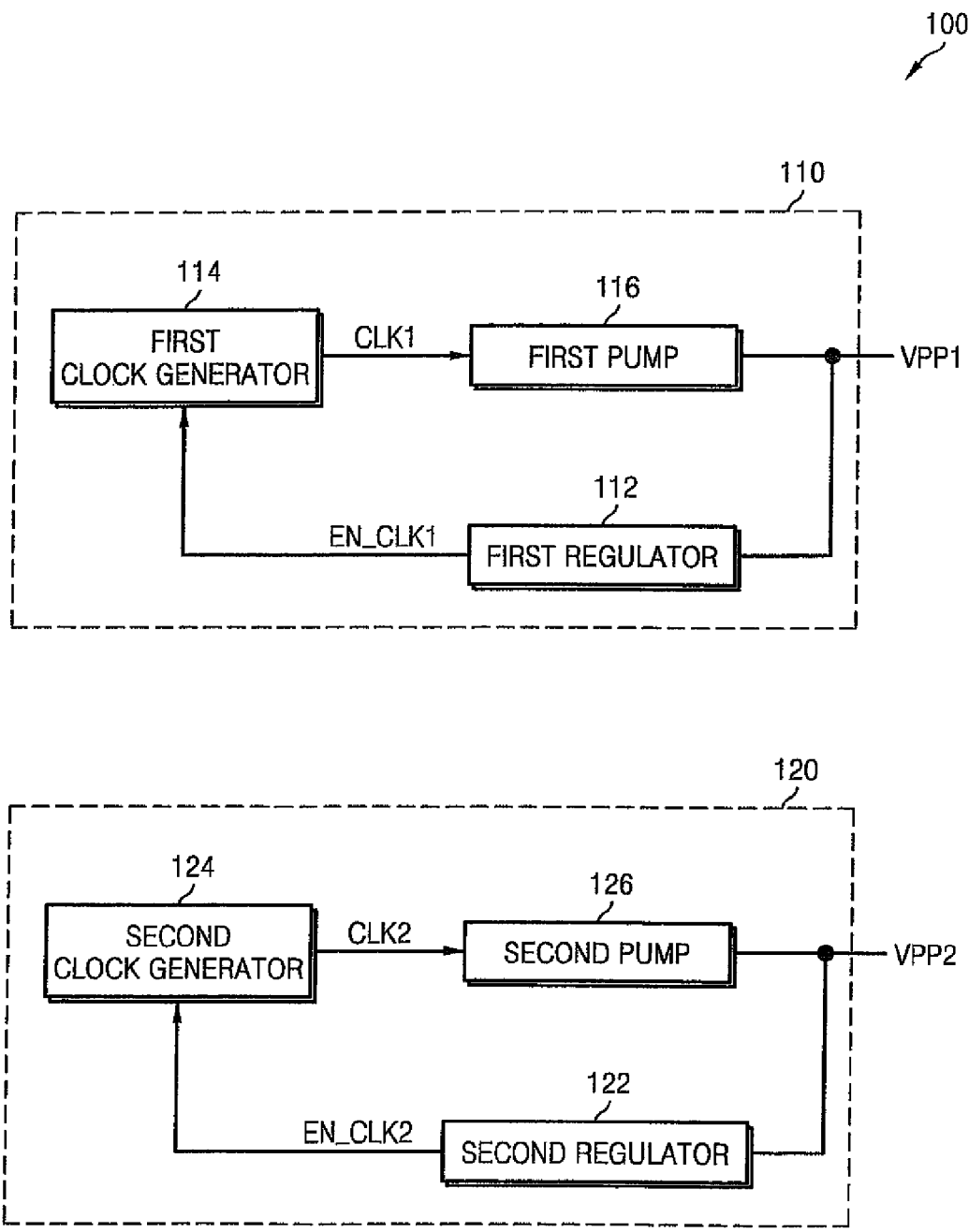
FIG. 1 is a block diagram of a conventional high voltage generation circuit.
Figure 2:
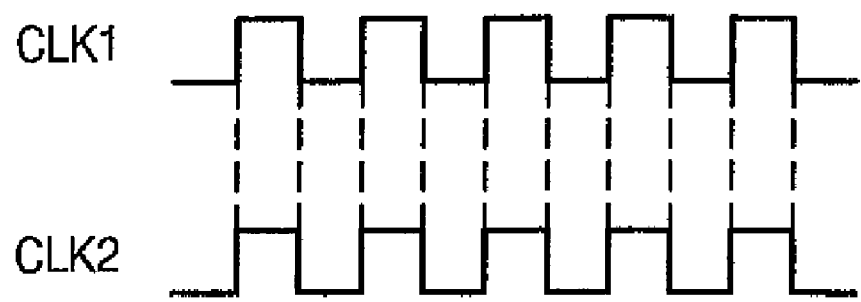
FIG. 2 is a timing diagram of clock signals for generating high voltages of a conventional high voltage generation circuit.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout. Furthermore, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 3:
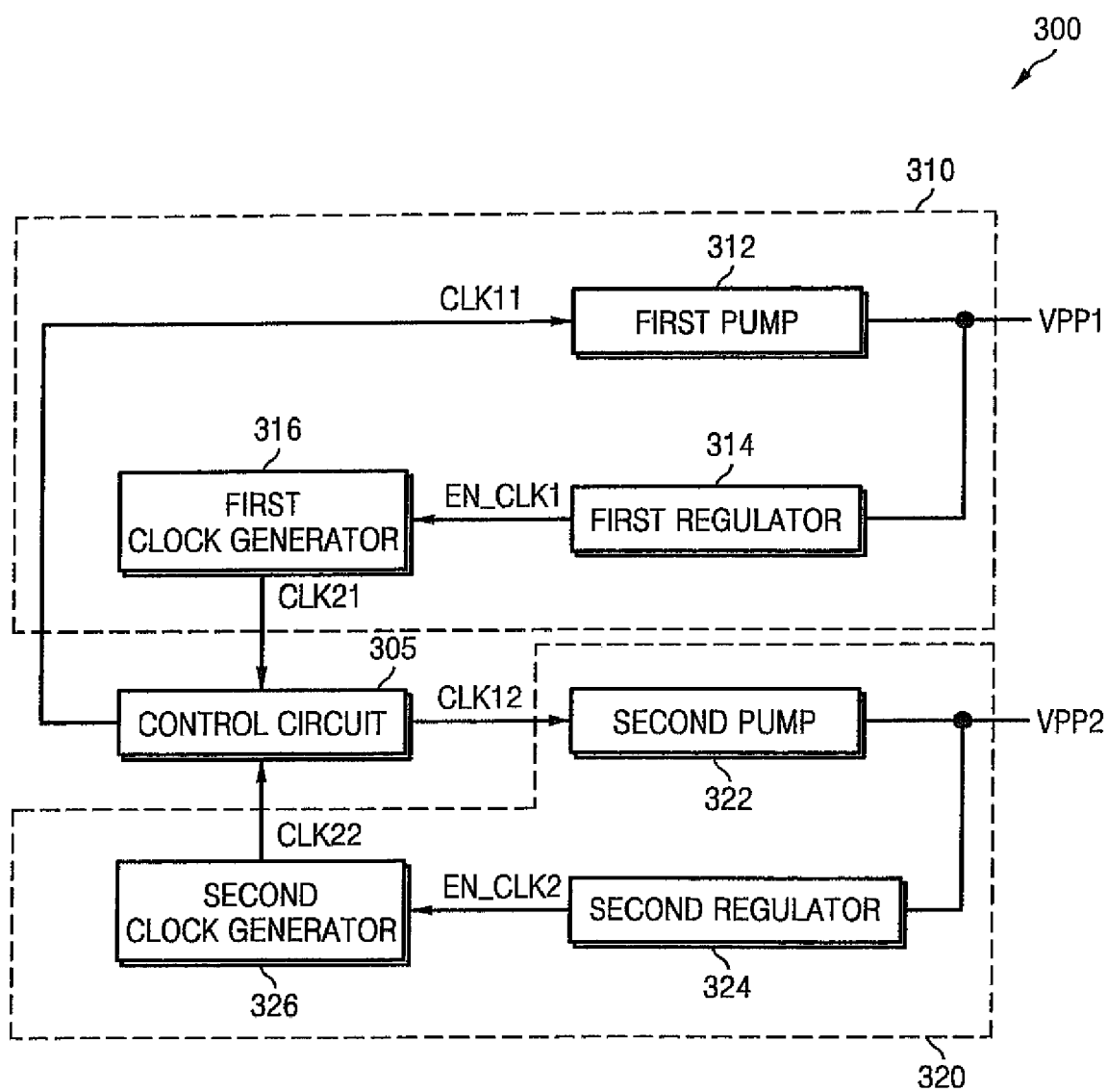
FIG. 3 is a block diagram of a high voltage generation circuit according to an embodiment of the present invention.

FIG. 3 is a block diagram of a high voltage generation circuit 300 according to an embodiment of the present invention which includes control circuit 305 and a plurality of high voltage generation units 310 and 320. High voltage generation unit 310 generates high voltage VPP1 in response to clock signal CLK11. High voltage generation unit 320 generates high voltage VPP2 in response to clock signal CLK12. The voltage levels of the high voltages VPP1 and VPP2 may differ and may be used for different purposes. For example, voltage signal VPP1 may be used as a program voltage and voltage signal VPP2 may be used as an erase voltage. High voltage generation unit 310 also generates second clock signal CLK21 based on the voltage level of signal VPP1. Similarly, voltage generation unit 320 generates second clock signal CLK22 based on the voltage level of signal VPP2. Control circuit 305 receives second clock signals CLK21 and CLK22 and generates first clock signals CLK11 and CLK12. First clock signals CLK11 and CLK12 do not toggle simultaneously based on second clock signals CLK21 and CLK22.

High voltage generation unit 310 includes pump 312, regulator 314, and clock generator 316. Similarly, high voltage generation unit 320 includes pump 322, regulator 324, and clock generator 326. Pump 312 generates high voltage signal VPP1 in response to first clock signal CLK11. Pump 322 generates high voltage signal VPP2 in response to first clock signal CLK12. Regulator 314 generates enable signal EN_CLK1 based on the voltage level of high voltage signal VPP1. Regulator 324 generates enable signal EN_CLK2 based on the voltage level of high voltage signal VPP2. Clock generator 316 generates second clock signal CLK21 in response to enable signal EN_CLK2. Clock generator 326 generates second clock signal CLK22 in response to enable signal EN_CLK2.

Figure 4:
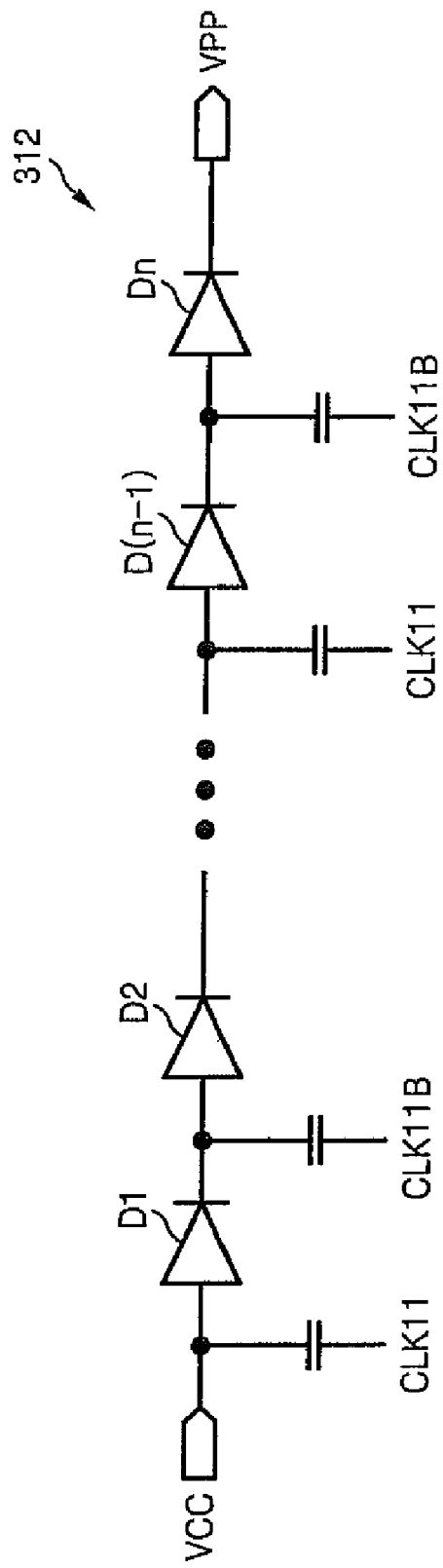
FIG. 4 is a circuit diagram of a pump illustrated in FIG. 3.

FIG. 4 is a circuit diagram of pump 312 shown in FIG. 3 which includes a plurality of diodes D1-Dn connected in series between power voltage line VCC and output terminal VPP. Pump 312 also includes a plurality of capacitors C1-Cn connected to the input terminals of diodes D1-Dn, respectively. Each of the capacitors C1-Cn is alternately enabled with an adjacent capacitor in response to first clock signal CLK11 or its complementary clock signal CLK11B. Enabled capacitors among the capacitors C1-Cn pump charge to output terminal VPP.

Figure 5:
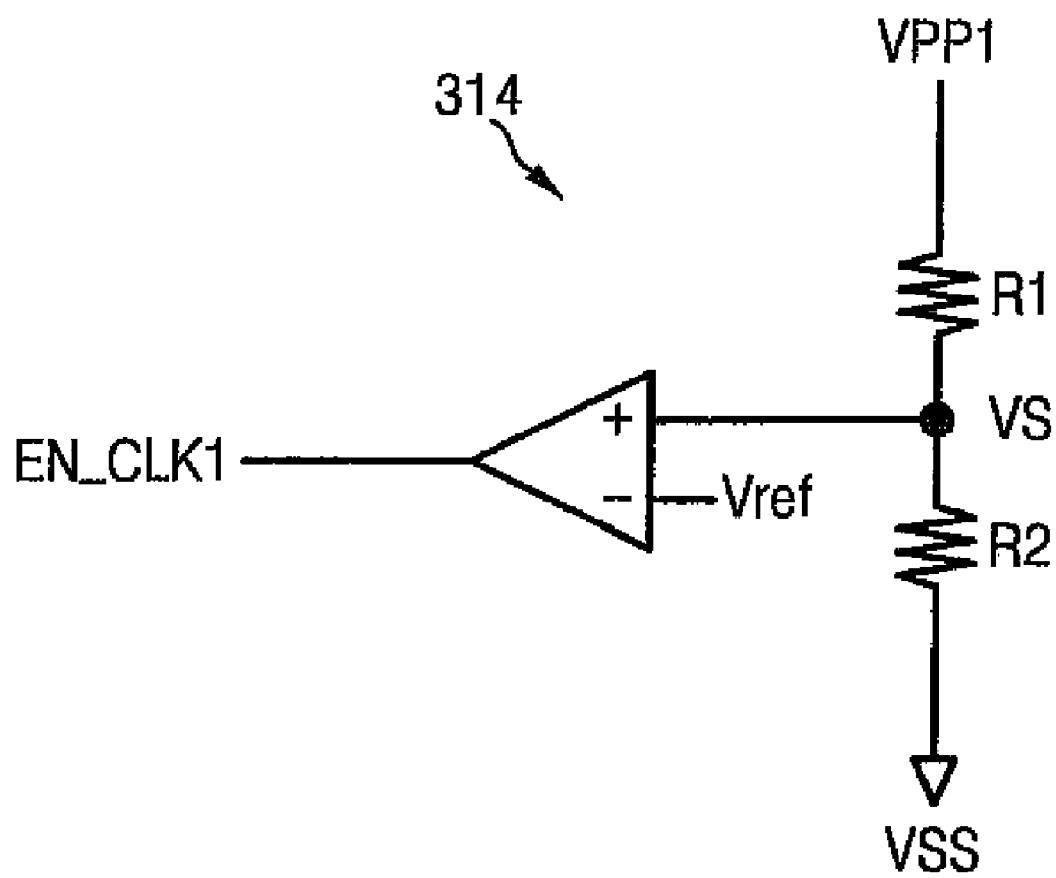
FIG. 5 is a circuit diagram of a regulator illustrated in FIG. 3.

FIG. 5 is a circuit diagram of the regulator 314 shown in FIG. 3. Regulator 314 generates enable signal EN_CLK1 based on the voltage level of high voltage signal VPP1 outputted by high voltage generation circuit 300. Regulator 314 compares a sensing voltage VS, which results from division of high voltage signal VPP1 by a plurality of voltage dividing resistors R1 and R2, with reference voltage Vref. The result of this comparison generates enable signal EN_CLK1. Regulator 314 may output enable signal EN_CLK1 having a first logic level value (e.g., a logic value "0") when sensing voltage VS is lower than the reference voltage Vref and may output the enable signal EN_CLK1 having a second logic level value (e.g., a logic value "1") when the sensing voltage VS is higher than the reference voltage Vref.

Figure 6:
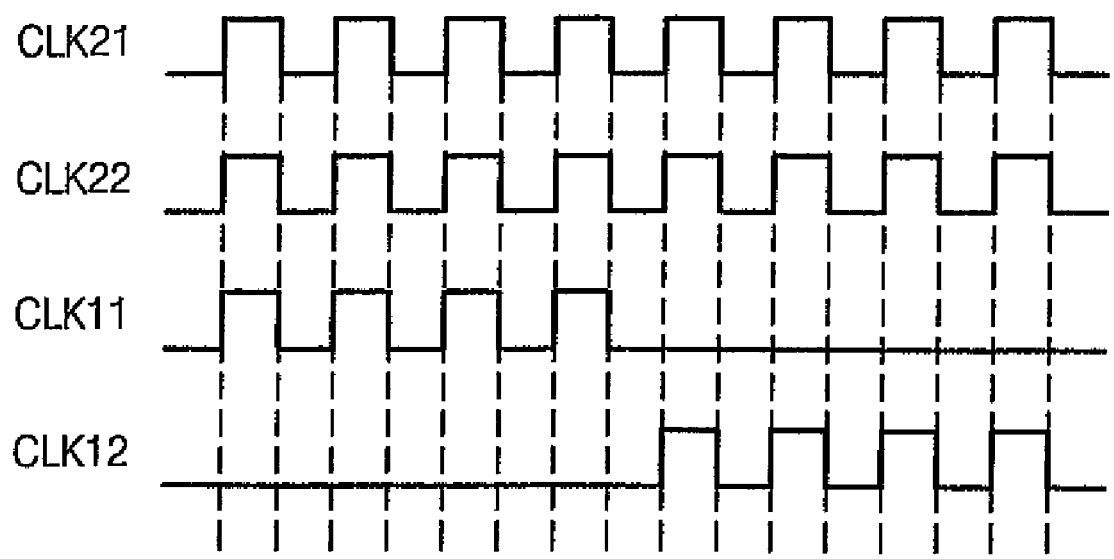
FIG. 6 is a timing diagram of clock signals for generating high voltages of a high voltage generation circuit according to an embodiment of the present invention.
Figure 7:
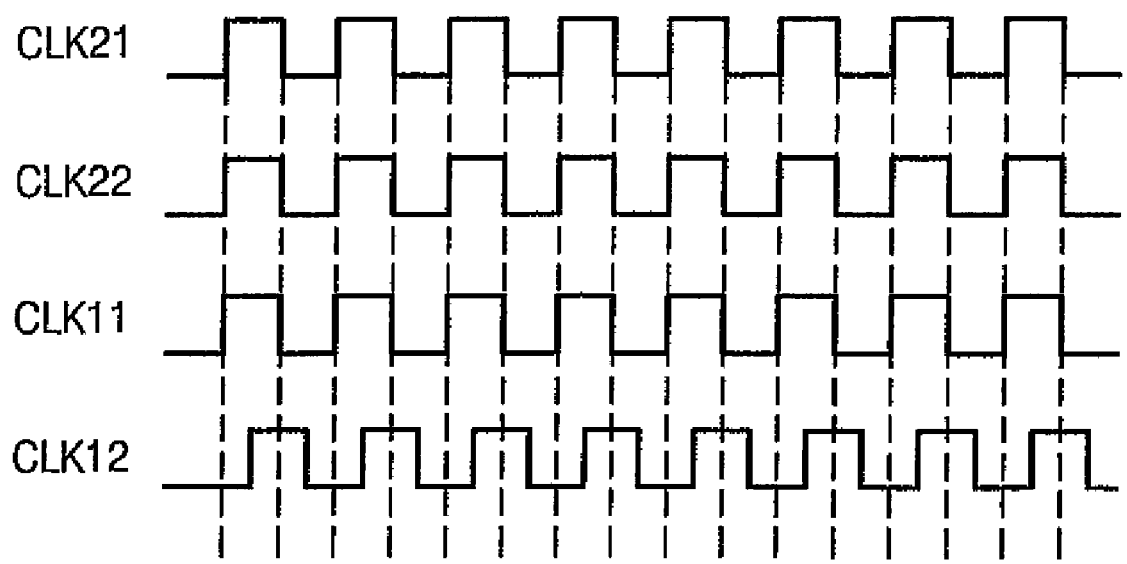
FIG. 7 is a timing diagram of clock signals for generating high voltages of a high voltage generation circuit according to an embodiment of the present invention.

FIGS. 6 and 7 are timing diagrams of clock signals CLK11-CLK22 for generating the high voltage signals of high voltage generation circuit 300. A procedure for generating the clock signals CLK11 through CLK22 and a procedure for generating the high voltages VPP1 and VPP2 will be described with reference to FIGS. 3 through 7 below. Clock generator 316 included in high voltage generation unit 310 generates second clock signal CLK21 in response to enable signal EN_CLK1 output from regulator 314. Clock generator 326 included in high voltage generation unit 320 generates second clock signal CLK22 in response to enable signal EN_CLK2 output from regulator 324. As illustrated in FIGS. 6 and 7, the second clock signals CLK21 and CLK22 may have the same phase. Control circuit 305 receives second clock signals CLK21 and CLK22 and generates the first clock signals CLK11 and CLK12 by controlling the toggling period or the phase of each of the second clock signals CLK21 and CLK22. Control circuit 305 controls second clock signals CLK21 and CLK22 so that first clock signals CLK11 and CLK12 do not toggle simultaneously, as illustrated in FIG. 6. In this manner, control circuit 305 generates first clock signals CLK11 and CLK12, which do not toggle simultaneously, based on second clock signals CLK21 and CLK22. As a result, pumps 310 and 320 do not perform a pumping operation simultaneously. Because the operation periods of pumps 310 and 320 do not overlap, the peak value of consumption current and power noise in the high voltage generation circuit 300 is reduced. Alternatively, control circuit 305 controls second clock signals CLK21 and CLK22 so that first clock signals CLK11 and CLK12 have different phases as illustrated in FIG. 7. As a result, pumps 312 and 322 start pumping operations at different points and therefore, the peak value of consumption current and power noise in the high voltage generation circuit 300 is reduced. As described above, a high voltage generation circuit reduces the peak value of consumption current and power noise to provide stable high voltages for a semiconductor memory device.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A high voltage generation circuit in a semiconductor memory device comprising:
a plurality of high voltage generation units configured to respectively generate high voltage signals having different voltage levels in response to first clock signals, said high voltage generation units configured to generate second clock signals based on the voltage levels of the high voltage signals, respectively; and
a control circuit configured to receive the second clock signals and to generate the first clock signals, said first clock signals configured not to toggle simultaneously based on the second clock signals.

2. The high voltage generation circuit of claim 1, wherein each of the high voltage generation units comprises:
a pump configured to generate a corresponding one of the high voltage signals in response to a corresponding one of the first clock signals;
a regulator coupled to said pump and configured to generate an enable signal based on the voltage level of the corresponding high voltage signal; and
a clock generator coupled to said regulator and configured to generate a corresponding one of the second clock signals in response to the enable signal.

3. A high voltage generation circuit comprising:
a plurality of high voltage generation units configured to respectively generate high voltage signals having different voltage levels in response to first clock signals, said high voltage generation units respectively generating second clock signals based on the voltage levels of said high voltage signals; and
a control circuit configured to receive the second clock signals from said high voltage generation units and to generate said first clock signals having different phases based on said second clock signals.

4. The high voltage generation circuit of claim 3 wherein each of the high voltage generation units comprises:
a pump configured to generate a corresponding one of the high voltage signals in response to a corresponding one of the first clock signals;
a regulator coupled to said pump and configured to generate an enable signal based on the voltage level of the corresponding high voltage signal; and
a clock generator coupled to said first regulator and configured to generate a corresponding one of the second clock signals in response to the enable signal.

5. A high voltage generation method for a semiconductor memory device comprising:

generating high voltage signals having different voltage levels in response to first clock signals, respectively;

generating second clock signals based on the voltage levels of the high voltage signals, respectively; and generating the first clock signals, which do not toggle simultaneously, based on the second clock signals.

6. The high voltage generation method of claim 5 wherein generating the high voltage signals and the second clock signals further comprises:

generating each of the high voltage signals in response to the first clock signals, respectively;

generating enable signals based on the voltage levels of the high voltage signals, respectively; and generating the second clock signals in response to the respective enable signals.

7. A high voltage generation method for a semiconductor memory device comprising:

generating high voltage signals having different voltage levels in response to first clock signals;

generating second clock signals based on the voltage levels of the high voltage signals; and generating the first clock signals, which have different phases, based on the second clock signals.

8. The high voltage generation method of claim 7 wherein generating the high voltage signals and the second clock signals comprises:

generating the high voltage signals in response to the first clock signals;

generating enable signals based on the voltage levels of the high voltage signals; and generating the second clock signals in response to the enable signals, respectively.

* * * * *